United States Patent
Grillo et al.

(10) Patent No.: US 7,157,974 B2
(45) Date of Patent: Jan. 2, 2007

(54) POWER AMPLIFIER AND METHOD FOR POWER AMPLIFICATION

(75) Inventors: Giuseppe Grillo, Eindhoven (NL); Domenico Cristaudo, Eindhoven (NL)

(73) Assignee: NXP B.V., Eindhoven (NL)

( * ) Notice: Subject to any disclaimer, the term of this patent is extended or adjusted under 35 U.S.C. 154(b) by 143 days.

(21) Appl. No.: 10/529,666

(22) PCT Filed: Sep. 12, 2003

(86) PCT No.: PCT/IB03/04013

§ 371 (c)(1),
(2), (4) Date: Mar. 29, 2005

(87) PCT Pub. No.: WO2004/032317

PCT Pub. Date: Apr. 15, 2004

(65) Prior Publication Data

US 2006/0066403 A1    Mar. 30, 2006

(30) Foreign Application Priority Data

Oct. 3, 2002    (EP) .................................... 2079137

(51) Int. Cl.
  *H03G 3/10*    (2006.01)
(52) U.S. Cl. .................. 330/285; 330/296; 330/310
(58) Field of Classification Search ............... 330/285, 330/296, 310
  See application file for complete search history.

(56) References Cited

U.S. PATENT DOCUMENTS

| | | | |
|---|---|---|---|
| 5,537,080 A * | 7/1996 | Chawla et al. ............ 330/266 |
| 5,923,215 A | 7/1999 | Hans | |
| 5,977,829 A | 11/1999 | Wells | |
| 6,122,491 A | 9/2000 | Francisco | |
| 6,236,266 B1 | 5/2001 | Choumei et al. | |
| 6,333,677 B1 * | 12/2001 | Dening ...................... 330/296 |
| 6,404,284 B1 * | 6/2002 | Johnson ..................... 330/149 |
| 6,522,197 B1 * | 2/2003 | Nam et al. .................. 330/133 |
| 6,859,098 B1 * | 2/2005 | Husseini ..................... 330/133 |
| 2002/0132652 A1 * | 9/2002 | Steel et al. ................ 455/574 |

FOREIGN PATENT DOCUMENTS

| EP | 0 734 118 A1 | 9/1996 |
|---|---|---|
| EP | 0734118 | 9/1996 |

* cited by examiner

*Primary Examiner*—Patricia Nguyen
(74) *Attorney, Agent, or Firm*—Peter Zawilski

(57) ABSTRACT

The invention provides a method for reducing power dissipation in a power amplifier used in wireless communication systems, said power amplifier having transistors showing a quiescent current, wherein the quiescent current of the power amplifier is adaptively changed according to the average output power of the power amplifier. A power amplifier for use in wireless communication systems is provided, said power amplifier having transistors showing a quiescent current, comprises adaptive biasing means changing the quiescent current of the power amplifier in accordance with the average output power of the power amplifier for reducing power dissipation in the power amplifier. A UMTS hand set comprises a power amplifier as specified above.

21 Claims, 5 Drawing Sheets

POWER AMPLIFIER AND METHOD FOR POWER AMPLIFICATION

The invention relates to a power amplifier and a method for power amplification in modem wireless and telecommunication systems.

Modem wireless and telecommunication systems require the power amplifier to operate in linear mode to maximize the spectral efficiency of the system. However, linearity requirements conflict with efficiency requirements. Typically a linear power amplifier will be biased in class-B or class-AB and in order to reach the linearity specification will be backed off from its peak envelope power PEP of about 10 dB. As a consequence, the power added efficiency PAE of the power amplifier will be compromised.

In power amplifiers for mobile communication the output power $P_{out}$ is varying according to the communication requirements. The supply voltage, which is conventionally derived from a battery, is fixed to a certain value. The supply current $I_{DC}$ will vary with the output power for amplifiers that are working in class-AB or B. The output current $i_o$ of a class-AB or class-B is a truncated sinusoidal current. For a class-B, the conduction angle, i.e. the fraction of the sinusoid in which the power amplifier generates current, is exactly equal to $\pi$, which means also $I_Q=0$. For a class-AB the conduction angle is greater than $\pi$ and therefore $I_Q>0$. The supply current $I_{DC}$ is always greater than or equal to the quiescent current $I_Q$.

In conventional solutions $V_{DC}$ is set to the maximum value allowed by the manufacturing technology, and it is provided via a supply generator (battery). The maximum power added efficiency PAE is reached at maximum output power. It can be shown that a power amplifier will show a power added efficiency lower than its maximum PAE that can be achieved when functioning at Output Power levels below the maximum levels.

In state-of-the-art mobile and wireless communication schemes the average output power of the power amplifier is set by the network in order to maximize the cell capacity. As a consequence, power amplifiers are not required to transmit continuously at maximum output power, but they are very often backed off to lower power levels (in(W-)CDMA systems usually 10 dB lower). The power amplifier will show a lower power added efficiency and therefore a relatively higher power consumption. For example, it is calculated that a power amplifier for a UMTS handset with power added efficiency $PAE_{max\ \%}=35\%$ will show typically power added efficiency $PAE=12\%$ at 10 dB back-off.

The power amplifier output power is varied in order to adapt it to the communication requirement. In (W-)CDMA systems, for instance, the output power is varied in order to maximize cell-capacity. The base station measures the received output power from the handset and sends commands to the handset to adjust the output power to a better value. This is called Power Control Loop, and an example of it can be found, for UMTS in ETSI: "UMTS TETRA standard", chapter TS 125.101, pages 11–13, ETSI 2001 and ETSI: "UMTS TETRA standard", chapter TS 125.214, pages 10–20, ETSI, 2001.

As the output power is varied so will the supply current $I_{DC}$; namely, as the output power is decreased, so will the supply current. In fact, the conduction angle will increase and the current $I_{DC}$ will tend to its minimum value $I_Q$. The variation of $I_{DC}$ changes the performance of the active devices in the power amplifier, and leads to gain and linearity variation. At very low output power, the power dissipation will be independent of the output power level. In this situation the power stage is working as a class-A amplifier.

The high power dissipation of the power amplifier in modern mobile and wireless communication is affecting the performance of the communication equipment, especially mobile equipment such as mobile telephones and terminals. This dissipation has to be reduced.

In mobile communication and wireless systems the power amplifier is typically biased in class-AB. Class-B amplifiers are affected by cross-over problems and are not linear enough to comply with the linearity specification of communication standards. Class-A amplifiers are linear enough for the application but they dissipate far more than class-AB and are therefore not used. All the other classes of amplifiers are not linear enough for the standard, and require the adoption of complex linearization techniques. Those techniques are not attractive for mobile equipment implementation.

The typical power amplifier for this kind of application is divided into a driver stage and a power stage. The driver stage could be composed of several cascaded stages. The two stages are connected via a matching network between them and via two other matching networks to the input and the output. A Biasing block sets the quiescent current of both the driver and the power stage.

The power stage of the power amplifier is optimized for functioning at maximum output power, in which $I_{DC}>I_Q$. The linearity of the complete power amplifier is set to the minimum required by the specification, in order to get the maximum achievable power added efficiency. When working at lower output power, $I_{DC}$ decreases in the power stage. Because of this the gain, the input and the output impedance of the stage vary. These variations are usually partly compensated for by correctly choosing the biasing of the driver stage such that the gain remains as constant as possible. In fact, as soon as the power stage will start to increase (expand) its gain, because of increasing $I_{DC}$, the driver stage will typically decrease (compress) the gain, so that gain flatness is achieved for a wide range of output power. Moreover, linearity of the power amplifier increases for lower output power up to a level far beyond the standard requirements.

FIG. 1 shows a block diagram of a conventional power amplifier. Two stages, a driver stage 2 and a power stage 4 are connected via a matching network 6 between them and via two other matching networks 8 and 10 to the input and the output. A Biasing block 12 sets the quiescent current of both the driver and the power stage.

FIG. 2 shows a more detailed block diagram of the conventional power amplifier of FIG. 1 where the same reference numbers are used for the same items. The power amplifier, for example the power amplifier UAA3592 of PHILIPS SEMICONDUCTORS, consists of the power stage 4 and the driver stage 2 interconnected by the matching network 6. The input matching network 8 converts the input impedance of the driver stage 2 to the nominal impedance. The output matching network 10 maximizes the output power and removes the higher order components and is connected to an antenna 14. Two current biasing networks 13, 15 are providing a bias to the driver stage 2 and the power stage 4 respectively. A supply voltage Vcc is fed to the driver stage 2 and the power stage 4 through RF chokes 17, 19 respectively. The power amplifier has a 1 dB compression point equal to −4 dBm with respect to the input power. Although a UAA3592 is taken as an example for the power amplifier, the considerations can be extended to any power amplifier operating in class AB for CDMA schemes.

Further bias circuits are to be found in the state of the art mentioned below.

U.S. Pat. No. 6,236,266 shows a bias circuit and bias supply method for a multistage power amplifier including heterojunction bipolar transistors for power amplifying a high frequency signal and suppressing an increase in Rx noise during low-power output operation of the multistage power amplifier. The bias circuit outputs a control signal Vapc from an external control circuit to the base of only a first-stage amplifier HBT in the multistage power amplifier. To the base of the second and each later power amplifying stage HBT of the multistage power amplifier, the bias circuit supplies a bias current regulated by voltage stabilizers according to the control signal Vapc. In U.S. Pat. No. 6,236,266 the quiescent current of the amplifier is varied according to the power level, this technique is, however, applied with the goal to reduce the noise in receiver unit.

The EP 0 734 118 A1 shows an active biasing circuit to provide linear operation of an RF power amplifier. A current generator circuit provides a current to the stages of the RF power amplifier. In the final power amplifier stage the current is applied to a bias control amplifier that includes a transistor connected as a diode. The transistor diode is connected through a resistor to the emitter of a bias control transistor, which is in turn connected to and controls the gate of a transistor power amplifier in the final power amplifier stage of the RE power amplifier with a bias current that is the highest current level needed for highest RE power. The transistor diode and the current generator circuit are also connected to bias control transistors in the other stages of the RE power amplifier such that the other stages are likewise controlled with the current from the current generator. In the EP 0 734 118 A1 the goal is to maintain linear operation.

It is the object of the invention to provide a power amplifier and a method for power amplification wherein the power dissipation is drastically reduced, in particular in the case of a class-AB power amplifier.

This object is achieved by a method for reducing power dissipation in a power amplifier for use in wireless communication systems, said power amplifier having transistors showing a quiescent current, wherein the quiescent current of the power amplifier is adaptively changed according to the average output power of the power amplifier.

In an advantageous embodiment of the method of the invention, the adaptive biasing of the power amplifier having at least two stages, is done by changing the value of $I_Q$ of at least one of the stages of the power amplifier.

In an advantageous embodiment of the method of the invention, the adaptive biasing of the power amplifier having at least two stages, is done by changing the value of $I_Q$ of all the stages of the power amplifier.

In an other advantageous embodiment of the method of the invention, the adaptive biasing of the power amplifier having at least two stages, is done by changing the value of $I_Q$ of the power stage of the power amplifier.

In an advantageous embodiment of the method of the invention, the adaptive biasing of the power amplifier having at least two stages, is done by detecting the average output power of the power amplifier in a power detector and varying the value of $I_Q$ of the two stages according to the detected power and a specified function of an adaptive biasing network.

In an advantageous embodiment of the method of the invention, a voltage or current quantity proportional to the average output power is detected as average output power of the power amplifier.

In an advantageous embodiment of the method of the invention, a voltage or current quantity proportional to the average output power is detected in any of the stages of the power amplifier, preferably in a driver stage of the power amplifier.

In an advantageous embodiment of the method of the invention, the average output power is detected by applying a squaring function and averaging a scaled copy of the collector current of the driver and/or power stage.

In an advantageous embodiment of the method of the invention, the averaging function is carried out directly after the squaring function in the power detector.

In an other advantageous embodiment of the method of the invention, the averaging function is carried out in the adaptive biasing network.

The above object is achieved by a power amplifier for use in wireless communication systems, said power amplifier having transistors showing a quiescent current, comprising adaptive biasing means changing the quiescent current of the power amplifier according to the average output power of the power amplifier for reducing power dissipation in the power amplifier.

In a power amplifier comprising the adaptive biasing means, the dissipation is decreased and gain control is improved compared to state-of-the-art solutions. The invention is based on adaptively changing the quiescent current of the power amplifier according to the average output power, i.e. changing the value of $I_Q$ of at least one stage of the power amplifier. The invention has the following advantages when compared to state-of-the-art linear power amplifiers.

1. Reduced power amplifier dissipation (typically 70% reduction in dissipation).
2. Full integration in the power amplifier—there is no need for external components.
3. No need for additional pins.
4. Points 2 and 3 make the invention suitable for every handset without introducing changes in the architecture of the handset or in the layout of the PCB.

In a preferred embodiment of the power amplifier of the invention, the adaptive biasing means comprise a power detector detecting a quantity proportional to the output power of the power amplifier and an adaptive biasing network.

In a preferred embodiment of the power amplifier of the invention, the power detector is configured to provide a squaring function and an averaging function on a quantity proportionals the output power of the power amplifier.

In a preferred embodiment of the power amplifier of the invention, where the power amplifier comprises a driver stage, a current biasing network connected to the driver stage, an intermediate matching network, a power stage, and a current biasing network connected to the power stage, the power detector is connected to an input of the driver stage, and the adaptive biasing network is connected to the input of the power stage.

In a preferred embodiment of the power amplifier of the invention, the adaptive biasing network comprises a processing block connected to the power detector, and a current biasing network connected between the processing block and the input of the power stage.

In an embodiment of the power amplifier of the invention, the processing block comprises an analog-to-digital converter, a look-up table performing the function of changing the quiescent current of the power amplifier according to the average output power of the power amplifier, and a digital-to-analog converter.

In a preferred embodiment of the power amplifier of the invention, the processing block comprises a differential analog circuit implementing the function:

$$P_{DC}(I_Q) = \min I_Q(P_{DC}) \text{ with } \Delta G < \Delta G_{max} \text{ and spec (linearity)}$$

where $\Delta G$ is the gain variation and $\Delta G_{max}$ is the maximum gain variation allowed by the application, and the spec (linearity) is the linearity specification for the application.

In a preferred embodiment of the power amplifier of the invention, the processing block comprises an analog implementation circuit where a difference of $I_{pow} = I_{sq} - I_{ref}$ is calculated in the current domain and averaging is performed by a capacitor connected between a node carrying $I_{pow}$ and ground.

The analog implementation of the invention does not introduce steps in the biasing of the power amplifier, and therefore gives continuity of operation.

In a preferred embodiment of the power amplifier of the invention, a diode stage is connected between a node carrying $I_{pow}$ and ground.

In a preferred embodiment of the power amplifier of the invention, a resistor is connected between anode carrying $I_{pow}$ and a mirror circuit provided at the output of the processing block and outputting $I_{out}$.

The above object is also achieved by a UMTS hand set comprising a power amplifier configured as stated above.

These and various other advantages and features of novelty which characterize the present invention are pointed out with particularity in the claims annexed hereto and forming a part hereof. However, for a better understanding of the invention, its advantages, and the object obtained by its use, reference should be made to the drawings which form a further part hereof, and to the accompanying descriptive matter in which preferred embodiments of the present invention are illustrated and described.

Figure 1:
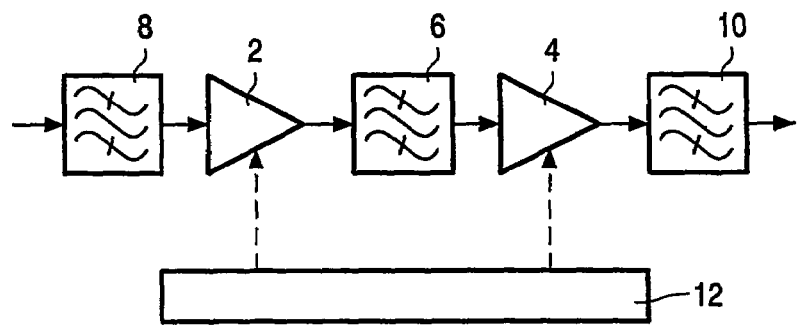
FIG. 1 shows a block diagram of a conventional power amplifier.
Figure 2:
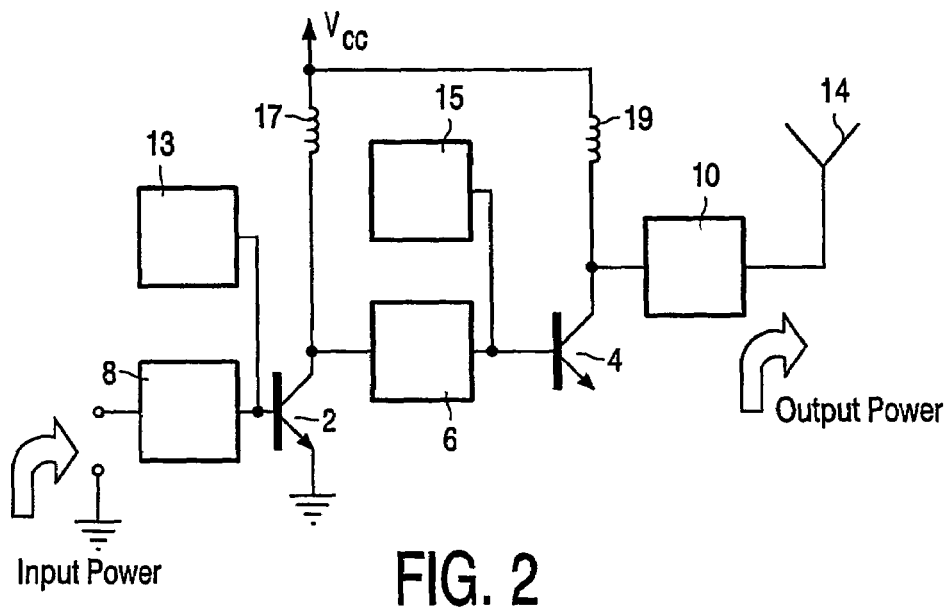
FIG. 2 shows a more detailed block diagram of the conventional power amplifier of FIG. 1, for example the power amplifier UAA3592 of PHILIPS SEMICONDUCTORS.
Figure 3:
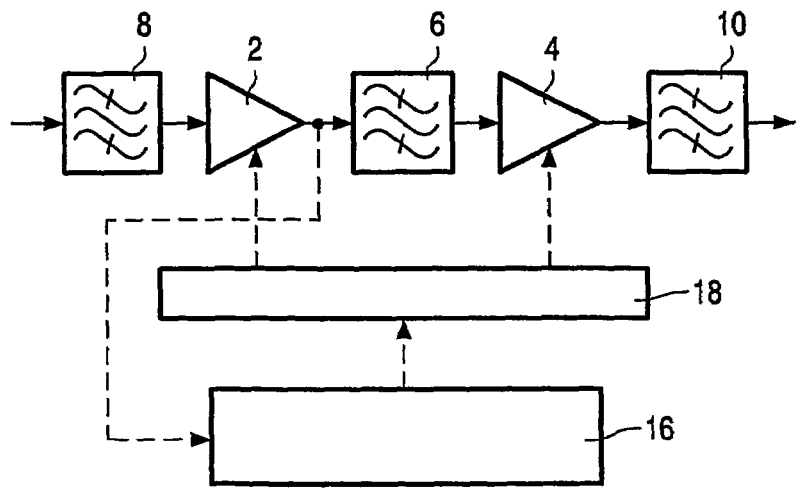
FIG. 3 shows a block diagram of a power amplifier according to an embodiment of the invention.

FIG. 3 again shows a power amplifier having the driver stage 2 and the power stage 4 which are connected via a matching network 6 between them and via the two matching networks 8 and 10 to the input and the output and to the antenna 14. The adaptive biasing means of the invention comprise a power detector 16 and an adaptive biasing circuit 18. The power detector 16 detects the average output power of the power amplifier and feeds it to the adaptive biasing circuit 18. The adaptive biasing circuit 18 varies the value of $I_Q$ of the two stages 2, 4 according to the detected power and a specified function. According to FIG. 3, the power detector senses the power at the output of the driver stage 2. However this sensing could be performed in any part of the power amplifier (input of the driver stage 2, output of the driver stage 2, input of the power stage 4, output of the power stage 4); what is important is that a quantity (voltage or current) is produced that is proportional to the average output power.

In order to avoid clipping and/or crossover effect reducing the accuracy of the power detector 16, it is advantageous to perform the power sensing in nodes in which the signals are fully sinusoidal; therefore it is recommendable to perform the sensing in the driver stage, which is mostly acting as a class-A.

Figure 4:
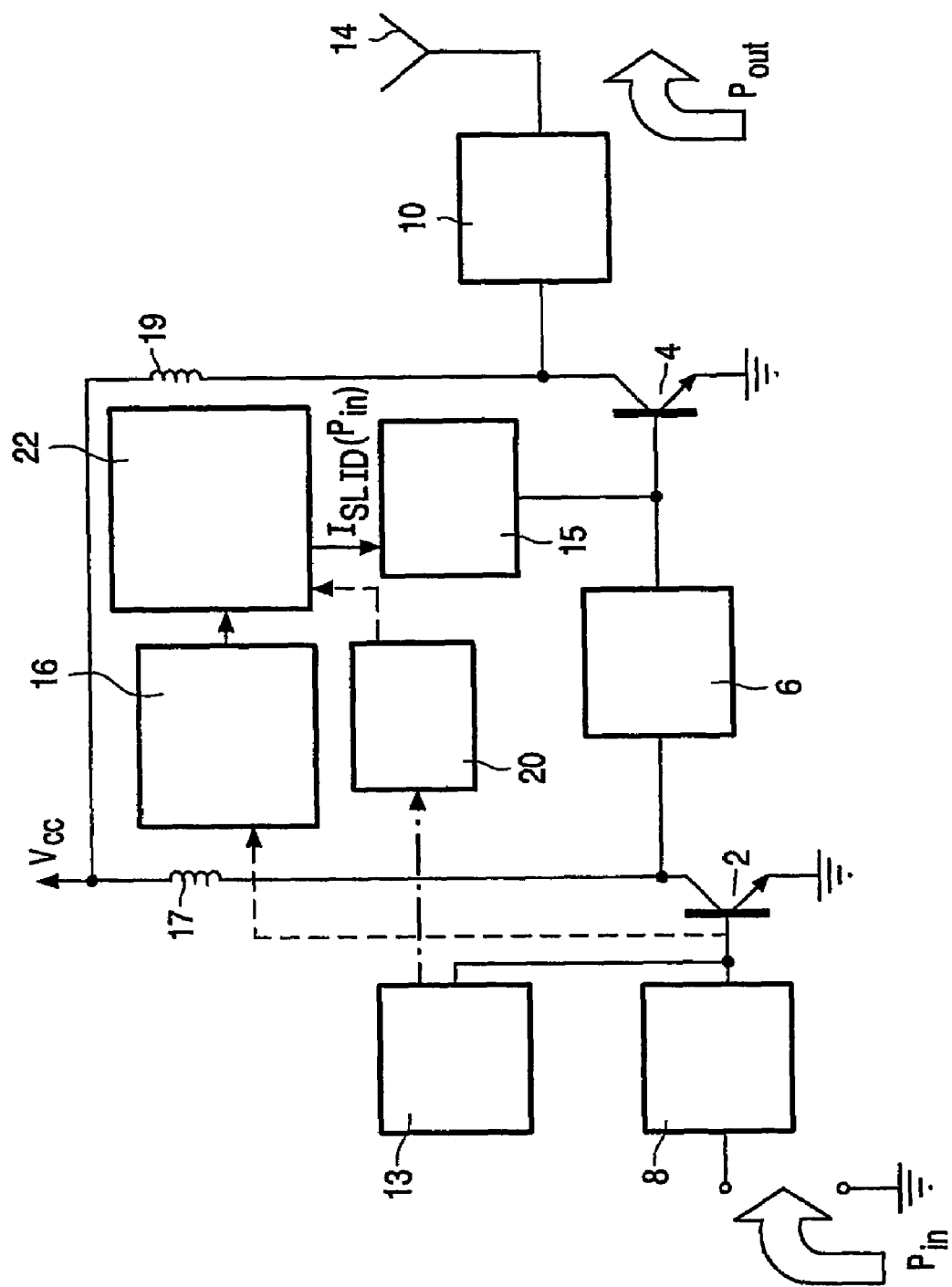
FIG. 4 shows a more detailed block diagram of the power amplifier according to an embodiment of the invention as shown in FIG. 3.

FIG. 4 shows the schematic of a linear power amplifier for UMTS with adaptative biasing with sliding biasing current using the adaptive biasing means 16, 18 driven by the input power. Basically, the RF power is read at the input of the power amplifier. Then the RF power controls quiescent current of the power stage 4. The adaptive biasing means controlled by the RF power has been divided into three sub-logical blocks: power detector 16, offset eraser 20 and processing block 22. In this embodiment, the power detector 18 is connected to the input of the driver stage 2. The offset eraser is connected between the current biasing network 13 and the processing block 22. The processing block is connected to the offset eraser 20 and to the power detector 18 and, furthermore, via the current biasing network 15 to the input of the power stage 4. The current biasing network 15 receives a signal $I_{SLID}(P_{in})$ which is a sliding biasing current depending on the input power, and feeds the power stage 4.

The power detector 16 produces a DC current proportional to the RF power, the offset eraser 20 cancels the DC offset of the power detector 16 due to the biasing and the processing block 22 performs filtering, integration and clipping function. In order to implement sliding biasing, it is needed to know the RF input or output power of the power amplifier. The RF power is sensed at the input of the power stage 2 (FIG. 4). This information is transformed by the power detector 16 into a current. The following processing block 19 avails to process this current.

Figure 5:
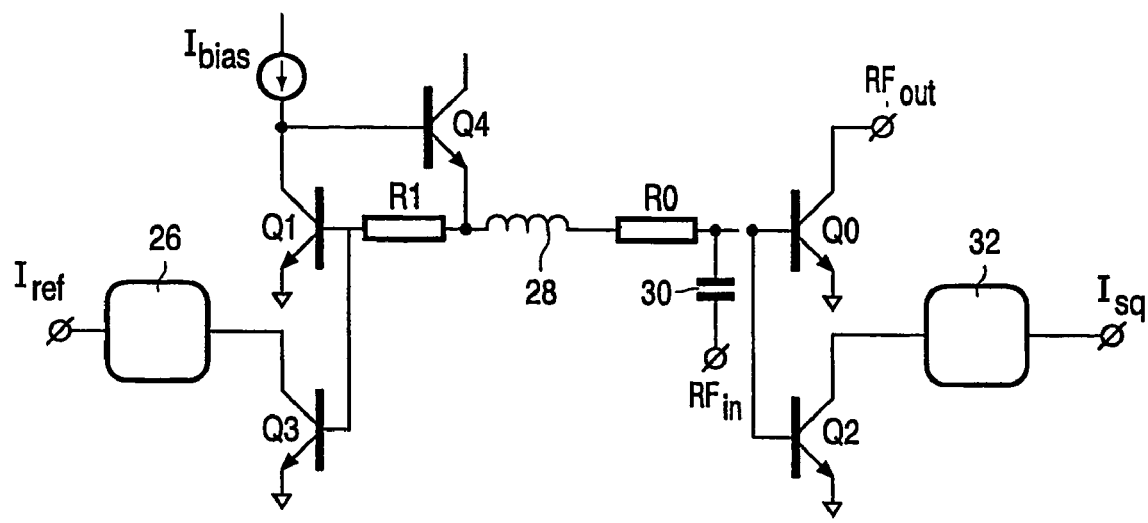
FIG. 5 shows a circuit diagram of a differential implementation of the power detector used in the power amplifier according to an embodiment of the invention as shown in FIG. 4.

The best way to implement a power detector 16 is utilizing a squaring function and averaging on a scaled copy of the collector current of the driver and/or power stage as shown in FIG. 5. To put the averaging function directly after the squaring function is possible but not needed. Averaging could be done also in the adaptive biasing circuit.

FIG. 5 shows a more detailed circuit of the power detector 16 in the power amplifier environment. A reference current $I_{ref}$ is fed via a squaring circuit 26 to a transistor Q3 the base of which is connected to the base of a transistor Q1 which is fed by $I_{bias}$. A further transistor Q4 is connected between $I_{bias}$ and via a resistor R1 to the base of the transistor Q1. The resistor is connected via an inductance 28 to a resistor R2 which is connected via a capacitance 30 a terminal carrying $RF_{in}$. The node between the resistor R2 and the capacitance 30 is connected to the base of a transistor Q0. The collector of the transistor Q0 is connected to a terminal carrying $RF_{out}$. The base of the transistor Q0 is connected to the base of a transistor Q2, the collector of which transistor is connected to a further squaring circuit 32 which outputs $I_{sq}$.

FIG. 5 shows the strategy to sense the RF and quiescent current. The RF current is sensed directly on the base of the driver BJT(Q0). In order to compensate for the offset created by the $I_{DC}$ of the driver stage, the quiescent level is detected on the biasing network by Q3. Duplicating the circuit of the power detector 16 to implement the offset eraser 20 permits to compensate for the temperature variations. As this offset eraser 20 is fed only with the quiescent component portion of the driver BJT, it compensates for the offset created by $Ic_{Q1-Q}$. The bipolar Q2 senses the RF signal, while Q3 detects only the portion of the quiescent current. Actually the inductor interrupts the RF path and consequently it ensures a decoupling between bias and RF circuits. The offset compensation can be performed by means of an independent current reference. This solution seems to be easier to implement, but the temperature changes in the power amplifier and tolerance introduced by the power detector will not be compensated for. To adopt a copy of power detector permits partially to compensate for these variations.

In order to counteract temperature variations and DC-offset a differential approach can be used in the power detector. FIG. 5 shows the differential implementation of the power detector. The RF power transistor is transistor Q0. The current $I_{bias}$ is mirrored by the transistor pair Q1–Q0 to transistor Q0. The quiescent current of transistor Q0 will be equal to:

$$I_{Q,0}=I_{bias} \times A_0/A_1 = m \times I_{bias}, \quad (1)$$

where $A_0$ and $A_1$ are the emitter area of transistor Q0 and transistor Q1 respectively. The collector current of transistor Q0 is mirrored to transistor Q2. Transistor Q2 is chosen to be smaller than transistor Q0. In order to reduce power dissipation, transistor Q2 senses the current of transistor Q0 according to the equation:

$$I_{c2}=I_{c0} \times A_2/A_0 = 1/n \times I_{c0}, \quad (2)$$

where $I_{c0}$ and $I_{c2}$ are the collector currents of transistor Q0 and Q2, respectively, and n is the ratio between the emitter areas of transistor Q2 and transistor Q0. Because of this the quiescent current of transistor Q2 will be proportional to the quiescent current of transistor Q0, transistor Q3 does not receive an RF signal on its base, because of the filtering effect of the inductance; therefore its collector current is constant and proportional to $I_{bias}$. If the emitter area ratio transistor Q3 to transistor Q1 is properly chosen, then the collector current of transistor Q3 will be equal to the quiescent current of transistor Q2. Therefore:

$$I_{C3}=A_3/A_1 \times I_{bias}=A_3/A_1 \times n/m \times I_{Q,2} \quad (3)$$

$$\text{If } A_3/A_2=n/m=A_2/A_1 \text{ than } I_{C3}=I_{Q,2} \quad (4)$$

The additional sensing transistor Q3 is used to compensate for temperature and biasing effects and cancel the $I_Q$-term from the output.

The collector currents of transistor Q1 and transistor Q3 will be squared, averaged and subtracted or, alternatively, squared, subtracted and averaged resulting in $I_{SQ}$. Subtracting $$I_{SQ}=I^2{}_{C2}=1/n^2 \times (I^2{}_Q+I^2{}_0/2-I^2{}_0/2 \cos(4\pi ft)) \quad (5)$$

from $$I_{ref}=I^2{}_{C1}=I^2{}_Q/n^2 \quad (6)$$

While neglecting the high-frequency terms one gets an output current:

$$I_{pow}=I_{SQ}-I_{ref}=I^2{}_0/2n^2 \quad (7)$$

$I_{pow}$ is directly proportional to the square amplitude of the current of the amplified signal and therefore to the average power. Since the quiescent current term does not appear in equation 7, the sliding biasing technique can be applied also to the same transistor on which the sensing is performed; in fact, what is controlled (the quiescent current) is not present in the sensed quantity (power indicator $I_{pow}$). In this way there is no risk of oscillation, which will be present in the case where the controlled quantity $I_Q$ will be present also in the sensed quantity.

In equation 5 it is assumed that the sensed amplifier works in class-A, i.e. that the sensed current has a perfect sinusoidal shape. Even though this assumption is not general, in order to reduce distortion effects and dissipation sensing is likely to occur at the output of the driver stage, which is mostly a class-A. Moreover, if the driver stage is a class-AB, the power sensing is likely to be needed only in a limited range of output power (and surely in back-off from the maximum power), which is expressed in equations 9a–9c by the parameters $P_1$ and $P_2$. In this condition the driver stage is likely to work in class-A or very close to class-A, so that equation 5 represents an appropriate approximation.

In equations 5 and 6 it is assumed that the squaring function is perfect. This is not necessary, and squaring circuits having low accuracy can be used as well. In fact, the high-frequency tones will be eliminated by the averaging and the effect of the quiescent current will be eliminated by the cancellation. Ultimately, the important thing is to have a monotone (Bi-univocal) function of the output power.

The goal of the adaptive biasing circuit is to generate an optimal $I_Q$ for the power amplifier with respect to the average output power. Therefore this block must function such that the dissipated power is at minimum with the linearity and gain variation constraint imposed, that is:

$$P_{DC}(I_Q)=\min I_Q(P_{DC}) \quad (8)$$

With $\Delta G < \Delta G_{max}$ and spec (linearity) where $\Delta G$ is the gain variation and $\Delta G_{max}$ is the maximum gain variation allowed by the application, and the spec (linearity) is the linearity specification for the application. This specification is usually in terms of ACLR and/or EVM but could be any linearity specification. In case of ACLR specification it could be useful to translate it into IM3 specification. The chosen function therefore depends on the type of power amplifier and on the application chosen.

The choice of the optimal adaptive $I_Q$ is strongly dependent on the application constraints. At very low power a conventional linear power amplifier is far more linear than required from the specifications. In this operating region the power amplifier acts as a class-A, and its IM3 ($3^{rd}$ order inter-modulation product) will be very low. The IM3 is dictating the linearity performance of linear power amplifiers. The IM3, for a linear power amplifier, decreases with 2 dB/dB slope with decreasing power, when backing off far from the 1 dB compression point.

One could think of decreasing $I_Q$ up to a value reaching the minimum IM3 allowed from the standard. However, at very low power, variation on the gain is important. Decreasing $I_Q$ from its optimal value to a lower value, can also bring about gain variation. In WCDMA standards (like UMTS), the gain variation should always be kept below a certain value, typically $\Delta G_{max}=1$ dB. This represents the main constraint in the choice of the function $I_Q=I_Q(P_{out})$ at low $P_{out}$.

The consequences for power dissipation when a lower $I_Q$ is chosen, are that the DC collector current $I_{DC}$ starts to increase for output power higher than 0 dBm. However, in low-quiescent current operation, the relative variation is much stronger. For the lower $I_Q$ values a gain variation is observed around $P_{out}=0$ dBm. For an output power higher than 20 dBm, $I_{DC}$ is not strongly influenced by the choice of $I_Q$.

$I_Q=I_Q(P_{out})$ is chosen as follows:

a) for low power: choose $I_Q$ as the minimum current allowing a gain variation smaller than the maximum allowed,
b) for intermediate power: vary $I_Q$ such that the linearity constraint is respected (typically IM3),
c) for high power: choose $I_Q$ to the nominal value, since it will not affect the dissipation.

Figure 6:
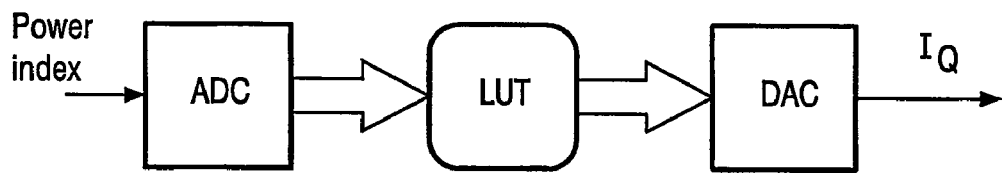
FIG. 6 shows a block diagram of a digital implementation of the adaptive biasing network shown in FIG. 4.

The implementation of this function could be done in the digital domain via an analog-to-digital converter ADC, a look-up table LUT and a digital-to-analog converter DAC as illustrated in FIG. 6. The analog-to-digital converter ADC digitizes the output of the power detector and passes it onto a look-up table which computes the correct value of quiescent current. This value will be passed onto the digital-to-analog converter DAC to be converted into the actual $I_Q$ (or a scaled version of it) to be fed to the biasing networks.

In the analog implementation of the adaptive biasing circuit, an analog block has to implement the function $I_Q=I_Q(P_{out})$ as in formula 10. The quantity $P_{out}$ is fed to the circuit via a voltage or a current generated by the power detector. The analog implementation is to be preferred to the digital implementation because, in the digital implementation, quantization noise on the quiescent current could introduce disturbances in the RF signal.

A possible implementation of the function could be expressed as follows:

$$I_Q = I_{Q1} \quad\quad P_{out} \le P_1 \quad\quad (9a)$$

$$I_Q = \frac{(I_{Q2}-I_{Q1})P_{out}+I_{Q1}P_2-I_{Q2}P_1}{P_2-P_1} \quad\text{for } P_1 \le P_{out} \le P_2 \quad (9b)$$

$$I_Q = I_{Q2} \quad\quad P_{out} > Ps \quad\quad (9c)$$

These equations state that for output power lower than a level Pr the quiescent current should be set to the value $I_{Q1}$. For output power larger than $P_2$ then the quiescent current should be set to $I_{Q2}$. For intermediate values the quiescent current should be set to intermediate values. The function expressed in equations 9a–9c has the advantage of being extremely simple and of easy implementation. It should be noted that, most presumably, for lower output power the quiescent current can be kept small. Therefore $I_{Q1}<I_{Q2}$. One can conclude that the saved power, at low output power levels, is given by the quantity:

$$P_{saved}=V_{DC}(I_{Q2}-I_{Q1}) \quad\quad (10)$$

Figure 7:
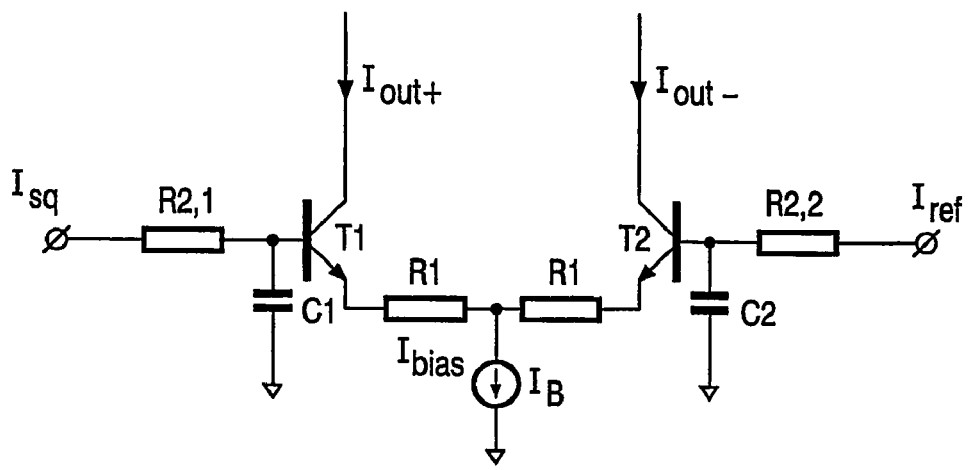
FIG. 7 shows, in the analog domain, an analog implementation of the adaptive biasing network shown in FIG. 4.

An implementation in the analog domain is represented in FIG. 7. The resistors R2,1 and RR2,2 and the capacitors C1 and C2 implement the averaging function, removing the high-frequency content of the current $I_{sq}$ and $I_{ref}$ (since $I_{ref}$ should not have high-frequency content the capacitor on its branch could be removed). Resistors R2,1 and R2,2 convert the low-frequency content of the currents $I_{sq}$ and $I_{ref}$ into a voltage $V=R_2(I_{sq}-I_{ref})$. This voltage is then reconverted to a current by the differential power amplifier. The biasing current $I_{bias}$ is fed via two resistors R1,1 and R1,2 to the emitters of transistors T1 and T2 which are connected to the node between the capacitor C1 and the resistor R2,1 and the node between the capacitor C2 and the resistor R2,2 respectively. The collectors of the transistors T1 and T2 are carrying $I_{out+}$ and $I_{out-}$ respectively. $I_{sq}$ is output from R2,1 and $I_{ref}$ is fed to R2,2.

$$I_{out}=I_{out+}-I_{out-}=R2/2R1(I_{sq}-I_{ref}) \quad\quad (11)$$

Equation 11 holds up to the output current not larger than the biasing current of the differential power amplifier, that is $I_{out} \le I_B$.

The behavior of this circuit can be analyzed with respect to equations 9a–9c as follows. At very low power the RF signal will not be able to generate an additional DC current in the transistor Q2 in FIG. 5. Therefore:

$$Ic2=Ic3I_{sq}=I_{ref}I_{out}=0. \quad\quad (12)$$

At intermediate power:

$$I_{c2}>I_{c3}I_{sq}-I_{ref}=I_{pow}>0 I_{out}=R2/2R1 \times I_{pow} \quad\quad (13)$$

At very high power the differential pair will saturate, and $$I_{out}=I_B. \quad\quad (14)$$

The equations 11–14, unless an additional constant, perfectly implement equation $$V_{DC}=V_{max}. \quad\quad (15)$$

Figure 8:
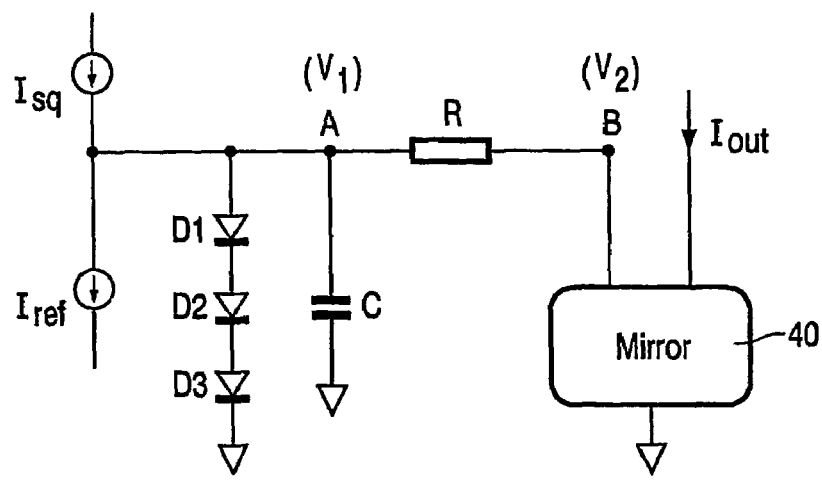
FIG. 8 shows, in the current domain, an analog implementation of the adaptive biasing network shown in FIG. 4.

An implementation of the processing block 22 in the current domain of the adaptive biasing circuit is represented in FIG. 8. The difference $I_{pow}=I_{sq}-I_{ref}$ is formed in the current domain, before averaging, which is performed by the capacitor C connected between node A (V1) and ground. The output current is equal to the low-power amplifier filtered version of $I_{pow}$, as desired. The clipping at high levels is performed by the resistor R and three diodes D1 to D3 connected between node A (V1) and ground. In fact the maximum output current is reached when the voltage at the node A is maximum, i.e. $V_A=3V_D$. In this case the current flowing through the resistor R will be equal to $I_R=(3V_D-V_B)/R$, $V_B$ being the voltage at the input of the current mirror, which may be assumed to be constant.

The circuit of FIG. 8 has two inputs $I_{sq}$ and $I_{ret}$ and one output $I_{out}$. $I_{sq}$ comes from the power detector. The input $I_{ret}$ comes from the reference circuit and it avails to erase the offset contained in $I_{sq}$. The diodes D1 to D3 are to clip the current as the nominal current level is reached. Above a certain output power, $V_1$ is large enough to permit the diodes to conduct. So the saturation of the output current $I_{out}$ starts, and excess $I_{det}$ flows through the diodes D1 to D3. The $I_{RF}$ contained in $I_{sq}$ is removed by the capacitor C. The capacitor C carries out two functions: filtering of the RF signal and with the resistor R integrating the DC current related to the RF power. So only $I_{det}$ is able to pass through resistor R and is then mirrored by the current mirror 40 in the output branch. As the power RF increases, $I_{det}$ increases as well. Consequently, also $V_1$ at node A increases and $V_2$ at node B remains constant.

Figure 9:
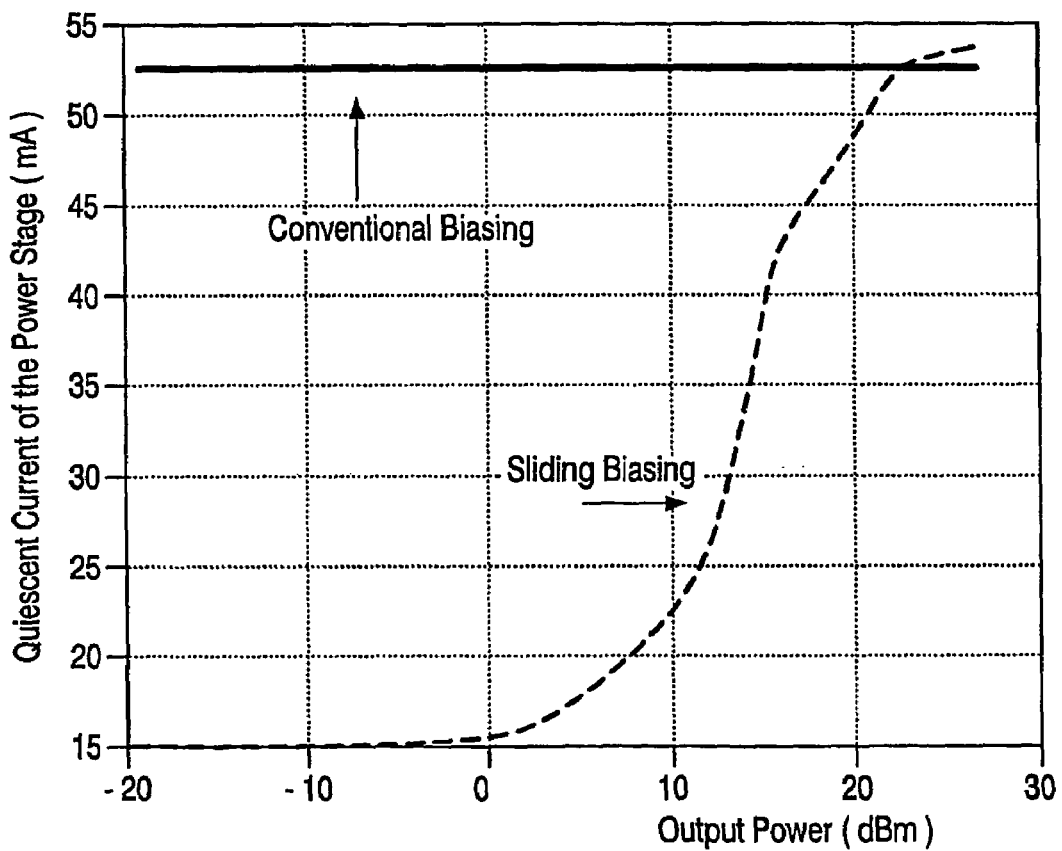
FIG. 9 shows a simulated $I_Q$ for the sliding biasing according to the invention and conventional biasing for a UMTS power amplifier.
Figure 10:
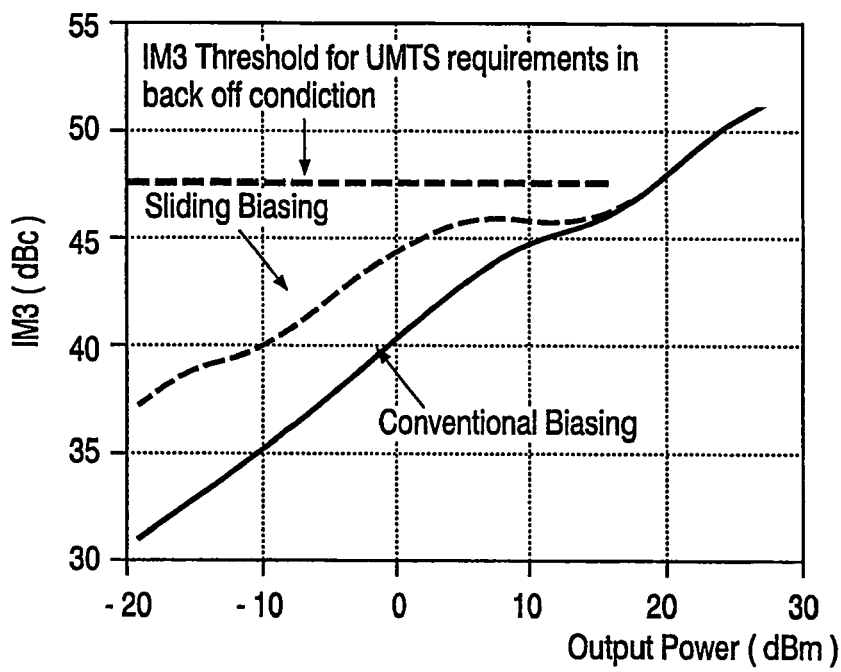
FIG. 10 shows a simulated IM3 for the sliding biasing according to the invention and conventional biasing for a UMTS power amplifier.

In FIG. 9 the simulated $I_Q$ as implemented by the circuit represented in FIG. 8 is represented. This implementation allows a gain variation smaller than 1 dB ($\Delta G<\Delta G_{max}=1$ dB). The consequences for linearity are shown in FIG. 10. It is possible to notice that, even if the IM3 is larger than the one in the conventional solution, we are still far below the required IM3. In order to estimate the reduction in power dissipation due to the technique, $P_{out}$ probability distributions of the (W-)CDMA schemes should be taken into account as explained in [6]. With the power probability distribution taken into account, this method causes a reduction in power consumption of up to 70%.

FIG. 9 shows the quiescent current in the power stage in mA versus the output power in dBm in case of conventional biasing and sliding biasing. Since the quiescent current determines the dissipation in back-off condition and for a large portion of the time the power amplifier will operate in this region, FIG. 9 implicitly shows a drastic reduction of the power dissipation. The quiescent current actually has been decreased by 3.5 times.

FIG. 10 shows IM3 in dBc versus the output power dBm in case of conventional and sliding biasing. With the choice of the minimum quiescent current starting from very low RF power, the course of the IM3 curve will be parallel to the IM3 curve of the conventional power amplifier, but will stay above it. It is worth noting that the sliding biasing acts so that the linearity specification of the UMTS standard is fulfilled.

Both curves have been obtained by supplying the power stage with the quiescent currents. The sliding current has been chosen so that the IM3 curve of the sliding power amplifier is below the IM3 threshold for UMTS requirements in back-off condition. As the RF power is increased IM3 exceeds the −40 dBc threshold. In this region the current is increased to recover the linearity and overcome the failure to meet the specification. Over the range between 0 dBm and 15 dBm there is a compensation between gain flatness and signal level, this is why the ΔIM3 remains almost constant.

In the range beyond 20 dBm the conventional level of quiescent current of the power stage is restored. In fact in this sector the DC current of the power stage does not depend on the quiescent current anymore, providing no advantage in the holding of a low bias point in terms of power saving. Then the IM3 curve of the sliding power amplifier overlaps the conventional power amplifier curve and the power amplifier will be able to deliver the maximum power with the necessary linearity. Sliding biasing has been carried out according to the biasing curve described with reference to FIG. 9.

Figure 11:
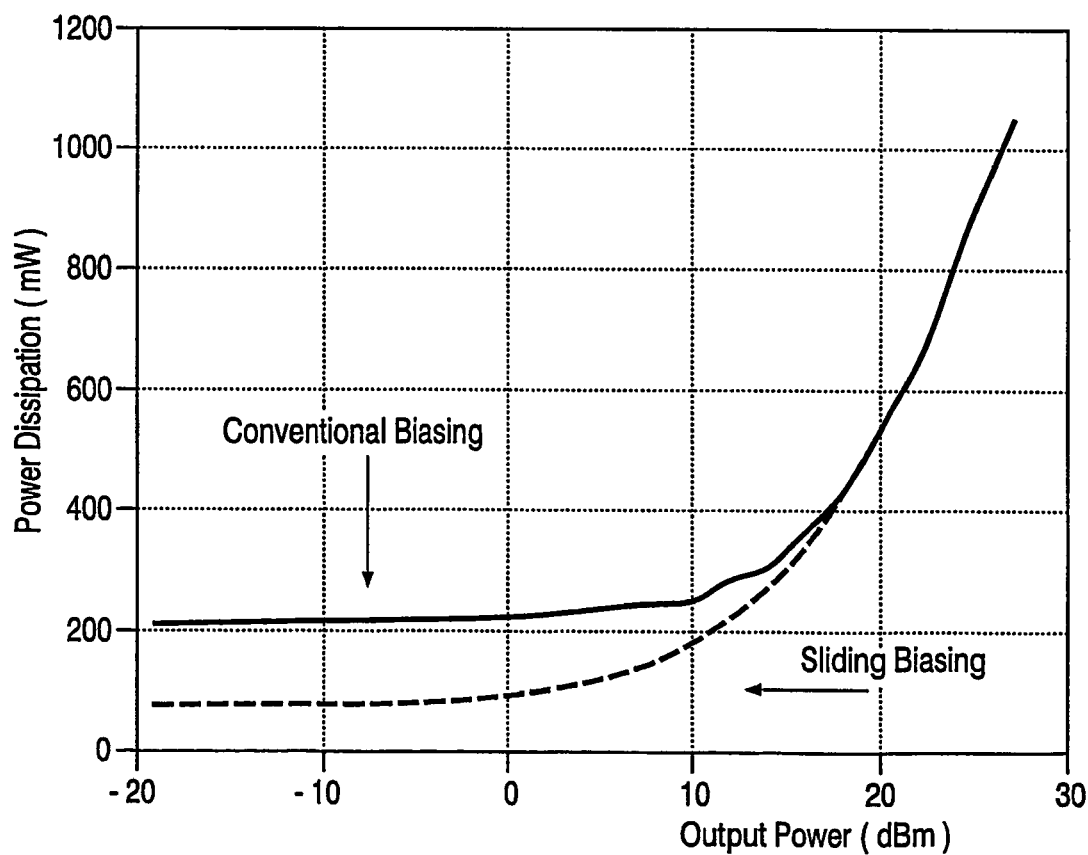
FIG. 11 shows a simulated power dissipation versus output power for the sliding biasing according to the invention and conventional biasing for a UMTS power amplifier.

FIG. 11 shows the power dissipation in mW versus output power in dBm in the case of sliding and conventional biasing for the UAA3592 power amplifier. The DC power dissipation has been reduced up to one third in deep back-off, i.e. the sliding biasing impact on the power consumption. The phone power distribution can be interpreted as a weighting function of the DC power dissipation shown in FIG. 11. Since the power amplifier spends 80% of the time for Pout<15 dB, and the DC power consumption in this region being strongly reduced as the quiescent current is decreased, this means that the sliding biasing technique is suitable to improve the consumption performance of the power amplifier. Furthermore, it has been verified that additional circuitry for the sliding biasing dissipates less than 1 mW. Hence it does not spoil the power saving of the power amplifier.

The proposed invention, with the power detector in a MOS form, implemented in a differential way as described in FIG. 5 and the adaptive biasing circuit as represented in FIG. 8, is under implementation for a UMTS power amplifier where the design is based on the UAA3592. The simulation results show feasibility of the invention and achieved results.

The invention can be applied to all class-A and class-AB power amplifiers working with a range of different output powers. At this moment an implementation is carried on for a UMTS power amplifier. However the invention can be successfully implemented for all the mobile communication standards (e.g. EDGE, UMTS, CDMA. W-CDMA, TD-SCDMA) and wireless standards requiring linearity of the power amplifier. The invention can applied to Bipolar and/or (MOS)FET power amplifiers, independent of the technology they use (Si, SiGe, GaAs, InP). All circuits presented in the application are in a BJT format but they can easily implemented in a MOSFET way.

New characteristics and advantages of the invention covered by this document have been set forth in the foregoing description. It will be understood, however, that this disclosure is, in many respects, only illustrative. Changes may be made in details, particularly in matters of shape, size, and arrangement of parts, without going beyond the scope of the invention. The scope of the invention is, of course, defined in the language in which the appended claims are expressed.

The invention claimed is:

1. Method for reducing power dissipation in a power amplifier for use in wireless communication systems, said power amplifier having transistors showing a quiescent current, wherein the quiescent current of the power amplifier is adaptively changed according to the average output power of the power amplifier.

2. The method of claim 1, wherein the adaptive biasing of the power amplifier having at least two stages, is done by changing the value of $I_Q$ of at least one of the stages of the power amplifier.

3. The method of claim 1, wherein the adaptive biasing of the power amplifier having at least two stages, is done by changing the value of $I_Q$ of all the stages of the power amplifier.

4. The method of claim 1, wherein the adaptive biasing of the power amplifier having at least two stages, is done by changing the value of $I_Q$ of the power stage of the power amplifier.

5. The method of claim 1, wherein the adaptive biasing of the power amplifier having at least two stages, is done by detecting the average output power of the power amplifier in a power detector and varying the value of $I_Q$ of the two stages according to the detected power and a specified function of an adaptive biasing circuit.

6. The method of claim 1, wherein a voltage or current quantity proportional to the average output power is detected as average output power of the power amplifier.

7. The method of claim 1, wherein a voltage or current quantity proportional to the average output power is detected in any of the stages of the power amplifier, preferably in a driver stage of the power amplifier.

8. The method of claim 5, wherein the average output power is detected by applying a squaring function and averaging a scaled copy of the collector current of the driver and/or power stage.

9. The method of claim 8, wherein the averaging function is carried out directly after the squaring function in the power detector.

10. The method of claim 8, wherein the averaging function is carried out in the adaptive biasing circuit.

11. A power amplifier for use in wireless communication systems, said power amplifier having transistors showing a quiescent current, comprising adaptive biasing means changing the quiescent current of the power amplifier according to the average output power of the power amplifier for reducing power dissipation in the power amplifier.

12. The power amplifier of claim 11, wherein the adaptive biasing means comprise a power detector detecting a quantity proportional the output power of the power amplifier and a adaptive biasing circuit.

13. The power amplifier of claim 12, wherein the power detector is configured to provide a squaring function and an averaging function on a quantity proportional to the output power of the power amplifier.

14. The power amplifier of claim 12, comprising a driver stage, a current biasing network connected to the driver stage, an intermediate matching network, a power stage, and a current biasing network connected to the power stage, wherein the power detector is connected to an input of the driver stage, and the adaptive biasing circuit is connected to the input of the power stage.

15. The power amplifier of claim 12, wherein the adaptive biasing circuit comprises a processing block connected to the power detector, and a current biasing network connected between the processing block and the input of the power stage.

16. The power amplifier of claim 15, wherein the processing block comprises an analog-to-digital converter, a look-up table providing the function of changing the quiescent current of the power amplifier according to the average output power of the power amplifier, and a digital-to-analog converter.

17. The power amplifier of claim 15, wherein the processing block comprises a differential analog circuit implementing the function:

$$P_{DC}(I_Q) = \min I_Q(P_{DC}) \text{ with } \Delta G < \Delta G_{max} \text{ and spec (linearity)}$$

where $\Delta G$ is the gain variation and $\Delta G_{max}$ is the maximum gain variation allowed by the application, and the spec (linearity) is the linearity specification for the application.

18. The power amplifier of claim 15, wherein the processing block comprises an analog implementation circuit where a difference of $I_{pow} = I_{sq} - I_{ref}$ is calculated in the current domain and averaging is performed by a capacitor connected between a node carrying $I_{pow}$ and ground.

19. The power amplifier of claim 18, wherein a diode stage is connected between a node carrying $I_{pow}$ and ground.

20. The power amplifier of claim 18, wherein a resistor is connected between a node carrying $I_{pow}$ and a mirror circuit provided at the output of the processing block and outputting $I_{out}$.

21. A UMTS hand set comprising a power amplifier configured as claimed in claim 11.

* * * * *